United States Patent [19]

Sweatman et al.

[11] Patent Number: 4,859,411

[45] Date of Patent: Aug. 22, 1989

[54] CONTROL OF SELENIUM ALLOY FRACTIONATION

[75] Inventors: Gerald H. Sweatman, Harpenden; Roy Hodgson, Huntingdon; Robert H. Haste, Stevenage, all of England

[73] Assignee: Xerox Corporation, Stamford, Conn.

[21] Appl. No.: 179,193

[22] Filed: Apr. 8, 1988

[51] Int. Cl.$^4$ ............................................. G22F 1/00
[52] U.S. Cl. ........................................ 419/23; 419/31; 419/33; 419/34; 419/66; 420/579; 420/590
[58] Field of Search .................. 420/579, 590; 419/31, 419/33, 34, 23, 66

[56] References Cited

U.S. PATENT DOCUMENTS

| | | | |
|---|---|---|---|
| Re. 32,744 | 9/1988 | Dulken et al. | 427/369 |
| 2,297,691 | 10/1942 | Carlson | 95/5 |
| 3,524,745 | 8/1970 | Cerlon et al. | 96/1.5 |
| 3,785,806 | 1/1974 | Henrikson | 75/134 H |
| 3,911,091 | 10/1975 | Karem et al. | 423/510 |
| 4,015,029 | 3/1977 | Elchisah | 427/76 |
| 4,205,098 | 5/1980 | Kobayashi et al. | 427/76 |
| 4,297,424 | 10/1981 | Hewitt | 430/60 |
| 4,379,820 | 4/1983 | Nakamura et al. | 430/58 |
| 4,379,821 | 4/1983 | Lutz et al. | 430/58 |
| 4,414,179 | 11/1983 | Robinetts | 420/579 |
| 4,439,508 | 3/1984 | Lutz et al. | 252/501.1 |
| 4,484,945 | 11/1984 | Badesha et al. | 75/5 A |
| 4,513,072 | 4/1985 | Dulken et al. | 430/57 |
| 4,554,230 | 11/1985 | Foley et al. | 430/58 |
| 4,583,608 | 4/1986 | Field et al. | 148/1 |
| 4,585,621 | 4/1986 | Oda et al. | 420/579 |
| 4,609,605 | 9/1986 | Lees et al. | 430/58 |
| 4,632,849 | 12/1986 | Ogawa et al. | 427/215 |
| 4,710,442 | 12/1987 | Koelling et al. | 430/85 |

FOREIGN PATENT DOCUMENTS 0091567  6/1982  Japan.
0172346  9/1985  Japan.
656486A  7/1982  Switzerland.

OTHER PUBLICATIONS

U.S. patent application Ser. No. 946,238.
U.S. patent application Ser. No. 935,907.

*Primary Examiner*—Stephen J. Lechert, Jr.
*Attorney, Agent, or Firm*—Peter H. Kondo; Judith L. Byorick

[57] ABSTRACT

A process for controlling fractionation in selenium alloys comprising providing pellets of an alloy comprising amorphous selenium and an alloying component selected from the group consisting of tellurium, arsenic, and mixtures thereof, the particles having an average particle size between about 300 micrometers and about 3,000 micrometers, exposing the pellets to an ambient temperature of between about 114° C. and about 190° C. until an exotherm occurs in the pellets resulting in substantially complete crystallization between about 104° C. and about 180° C., grinding the pellets into fresh powder having an average particle size of less than about 200 micrometers, and compressing the fresh powder into fresh pellets having an average weight between about 50 mg and about 1000 mg. The resulting fresh pellets may be heated in a vacuum chamber to vacuum deposit the alloy onto a substrate.

11 Claims, No Drawings

CONTROL OF SELENIUM ALLOY FRACTIONATION

BACKGROUND OF THE INVENTION

The present invention relates in general to treatment of selenium alloy particles prior to vapor deposition of the selenium alloy on a substrate and of using the treated selenium alloy particles in a process to vapor deposit a selenium alloy layer onto a substrate for electrophotographic imaging members.

The formation and development of images on the imaging surfaces of electrophotographic imaging members by electrostatic means is well knwon. One of the most widely used processes being xerography ndescribed, for example, in U.S. Pat. No. 2,297,691 to Chester Carlson. Numerous different types of electrophotographic imaging members for xerography, i.e. photoreceptors, can be used in the electrophotographic imaging process. Such electrophotographic imaging members may include inorganic materials, organic materials, and mixtures thereof. Electrophotographic imaging members may comprise contiguous layers in which at least one of the layers performs a charge generation function and another layer forms a charge carrier transport function or may comprise a single layer which performs both the generation and transport functions. These electrophotographic imaging members may be coated with a protective overcoating to improve wear.

Electrophotographic imaging members based on amorphous selenium have been modified to improve panchromatic response, increase speed and to improve color copyability. These devices are typically based on alloys of selenium with tellurium and/or arsenic. The selenium electrophotographic imaging members may be fabricated as single layer devices comprising a selenium-tellurium, selenium-arsenic or selenium-tellurium-arsenic alloy layer which performs both charge generation and charge transport function. The selenium electrophotographic imaging members may also comprise multiple layers such as, for example, a selenium alloy transport layer and a contiguous selenium alloy generator layer.

A common technique for manufacturing photoreceptor plates involves vacuum deposition of a selenium alloy to form an electrophotographic imaging layer on a substrate. Tellurium is incorporated as an additive for the purpose of enhancing the spectral sensitivity of the photoconductor. Arsenic is incorporated as an additive for the purpose of robusting the top layer and preventing surface crystallization at elevated temperatures. Typically, the tellurium addition is incorporated as a thin selenium-tellurium alloy layer deposited over a selenium alloy base layer to increase panchromaticity and broaden the spectral response. Fractionation of the tellurium and/or arsenic composition during evaporation results in a gradient in the deposited selenium alloy layer during vacuum evaporation. Thus, the term "fractionation" is used to described inhomogeneities in the stoichiometry of vacuum deposited alloy thin films. Fractionation occurs as a result of differences in the vapor pressure of the molecular species present in binary, ternary and other multicomponent alloys. Alloy fractionation is a generic problem with chalcogenide alloys. A key element in the fabrication of doped photoreceptors is the control of fractionation of additives such as tellurium and/or arsenic during the evaporation of selenium alloy layers. Tellurium and/or arsenic fractionation control is particularly important because the local tellurium and/or arsenic concentration at the extreme top surface of the structure, denoted as top surface tellurium or top surface arsenic, hereafter referred to as TSTE and TSA, respectively, directly affects xerographic sensitivity and copy quality. In single layer low arsenic selenium alloy photoreceptors, arsenic enrichment at the top surface due to fractionation can also cause severe reticulation of he evaporated film. In two layer or multilayer photoreceptors where low arsenic alloys may be incorporated as a base or transport layer, arsenic enrichment at the interface with the layer above can lead to severe residual cycle up problems. In single layer tellurium selenium alloy photoreceptors, tellurium enrichment at the top surface due to fractionation can cause excessive sensitivity to light. In two layer or multilayer photoreceptors where tellurium alloys may be incorporated as a generator layer, tellurium enrichment at the upper surface of the tellurium alloy layer can result in excessive charge trapping.

One method of preparing selenium alloys for evaporation is to grind selenium alloy shot (beads)and compress the ground material into pellet agglomerates, typically 150–300 mg. in weight and having an average diameter of about 6 millimeters (6,000 micrometers). The pellets are evaporated from crucibles in a vacuum coater using a time/temperature crucible designed to minimize the fractionation of the alloy during evaporation.

One shortcoming of a vacuum deposited selenium-tellurium alloy layer in a photoreceptor structure is the propensity of the seleniumtellurium alloy at the surface of the layer to crystallize under thermal exposure in machine service. To retard premature crystallization and extend photoreceptor life, the addition of up to about 1 percent arsenic to the selenium-tellurium alloy was found beneficial without impairment of xerographic performance. Selenium-tellurium-arsenic pellets produced by the pelletizing process exhibited a wider variability of top surface tellurium concentrations compared to selenium-tellurium pellets. This wider variability of top surface tellurium concentrations was manifested by a correspondingly wider distribution of photoreceptor sensitivity values than the top surface tellurium concentration variations in the seleniumtellurium alloy pellets. In an extended photoreceptor fabrication run, up to 50 percent of the selenium-tellurium-arsenic pellets were rejected for forming high top surface tellurium concentrations which caused excessive sensitivity in the final photoreceptor.

In deposited layers of alloys of Se-Te, the normal percentages of top surface tellurium can cause excessively high photosensitivity. This photosensitivity is variable and changes as the surface of the layer wears away. Surface injection of corona deposited charge and thermally enhanced bulk dark decay involving carrier generation cause the toner images in the final copies to exhibit a washed out, low density appearance. Excessive dark decay causes of loss of high density in solid areas of toner images.

Generally, for three layer photoreceptors, the middle layer is utilized for panchromatic frequency response and the top layers for protection without excessive red filtration. In systems operated at a single laser frequency, three layered photoreceptors contain, for example, a base layer of selenium doped with arsenic and chlorine, a generator layer of selenium doped with tellurium and a top layer of selenium doped with arsenic. The alloy of Se-Te is utilized in the middle layer to prevent dark decay. This dark decay is due only to thermally enhance the bulk dark decay free carriers generated. It is not due to any wear problem. This type of layered photoreceptor is prone to changes in the Te concentration profile through the thickness of the alloy layer due to Te diffusion. The diffusion rate is a function of the concentration of Te. Higher concentrations of Te diffuse at a higher rate. Such diffusion causes changes in the electrical properties as the concentration of Te changes. The diffusion route is from the top of the original Te containing layer into the subsequently deposited top layer which initially contained a zero percent concentration of Te. Diffusion is a greater problem in alloys of Se-Te compared to alloys of Se-Te-As because some cross-linking occurs in the latter alloy.

For alloys of Se-As, the high concentration of top surface arsenic causes reticulation of the surface of the deposited alloy layer. This occurs as the deposited surface cools down and the compositional differences through the thickness of the layer causes the surface to wrinkle. The deposited layer also exhibits electrical instability with excessive dark decay under certain conditions. When the photoreceptor comprises a single layer Se-As alloy, about 1 to about 2.5 percent be weight arsenic, based on the weight of the entire layer, at the surface of an alloy layer provides protection against surface crystallization. When the concentration of arsenic is greater than about 2.5 percent by weight, reticulation or electrical instability risks become higher. However, the shift in photosensitivity is not large.

In the past, shutters have been used over crucibles to control fractionation. These shutters are closed near the end of the evaporation cycle. The tellurium or arsenic rich material arising from the crucible deposits on the shutter rather than on the photoreceptor. However, in planetary coating systems, installation of shutters is complex, difficult and expensive. Further, after one or more coating runs, it is necessary to clean the surface of the shutters and the resulting debris can cause defects to occur in subsequently formed photoreceptor layers. Also, the debris created by moving parts of the shutter mechanism also pose severe problems in an ultraclean vacuum deposition environment.

Thus, a significant problem encountered in the fabrication of selenium alloy photoreceptors is the fractionation or preferential evaporation of a species such that the resulting film composition does not replicate the original composition. In other words, the deposited film or layer does not have a uniform composition extending from one surface to the other. For example, when tellurium is the dopant, the tellurium concentration is unduly high at the surface and approaches zero at the bottom of the vacuum deposited layer. This problem is also observed for alloys of Se-Te, Se-As, Se-As-Te, Se-As-Te-Cl, and the like and mixtures thereof.

PRIOR ART STATEMENT

U.S.-A No. 4,770,865 to W. Fender et al, issued Sept. 13, 1988—A process is described which includes heating an alloy comprising selenium and from about 0.05 percent to about 2 percent by weight arsenic until from about 2 percent to about 90 percent by weight of the selenium in the alloy is crystallized, vacuum depositing the alloy on a substrate to form a vitreous photoconductive insulating layer having a thickness of between about 100 micrometers and about 400 micrometers containing between about 0.3 percent and about 2 percent by weight arsenic at the surface of the photoconductive insulating layer facing away from the conductive substrate, and heating the photoconductive insulating layer until only the selenium in the layer adjacent the substrate crystallizes to form a continuous substantially uniform crystalline layer having a thickness up to about one micrometer. A thin protective overcoating layer is applied on the photoconductive insulating layer. The selenium-arsenic alloy may be at least partially crystallized by placing the selenium alloy in shot form in a crucible in a vacuum coater and heating to between about 93° C. (200° F.) and about 177° C. (350° F.) for between about 20 minutes and about one hour to increase crystallinity and avoid reticulation. Preferably, the selenium-arsenic alloy material in shot form is heated until from about 2 percent to about 90 percent by weight of the selenium in the alloy is crystallized. The selenium-arsenic alloy material shot may be crystallized completely prior to vacuum deposition to ensure that a uniform starting point is employed. However, if desired, a completely amorphous alloy may used as the starting material for vacuum deposition. In Examples II and V of this copending patent application, halogen doped selenium-arsenic alloy shot contained about 0.35 percent by weight arsenic, about 11.5 parts per million by weight chlorine, and the remainder selenium, based on the total weight of the alloy was heat aged at 121° C. (250° F.) for 1 hour in crucibles in a vacuum coater to crystallize the selenium in the alloy. After crystallization, the selenium alloy was evaporated from chrome coated stainless steel crucibles at an evaporation temperature of between about 204° C. (400° F.) and about 288° C. (550° F.).

U.S.-A No. 4,780,386 to M. Hordon et al, issued Oct. 25, 1988—A process is described in which the surfaces of large particles of an alloy comprising selenium, tellurium and arsenic, the particles having an average particle size of at least 300 micrometers and an average weight of less than about 1000 mg, are mechanically abraded while maintaining the substantial surface integrity of the large particles to form between about 3 percent by weight to about 20 percent by weight dust particles of the alloy based on the total weight of the alloy prior to mechanical abrasion. The alloy dust particles are substantially uniformly compacted around the outer periphery of the large particles of the alloy. The large particles of the alloy may be beads of the alloy having an average particle size of between about 300 micrometers and about 3,000 micrometers or pellets having an average weight between about 50 mg and about 1000 mg, the pellets comprising compressed finely ground particles of the alloy having an average particle size of less than about 200 micrometers prior to compression. In one preferred embodiment, the process comprises mechanically abrading the surfaces of beads of an alloy comprising selenium, tellurium and arsenic having an average particle size of between about 300 micrometers and about 3,000 micrometers while maintaining the substantial surface integrity of the beads to form a minor amount of dust particles of the alloy, grinding the beads and the dust particles to form finely ground particles of the alloy, and compressing the ground particles into pellets having an average weight between about 50 mg and about 1000 mg. In another embodiment, mechanical abrasion of the surface of the pellets after the pelletizing step may be substituted for mechanical abrasion of the beads. The process includes providing beads of an alloy comprising selenium, tellurium and arsenic having an average particle size of between about 300 micrometers and about 3,000 micrometers, grinding the beads to form finely ground particles of the alloy having an average particle size of less than about 200 micrometers, compressing the ground particles into pellets having an average weight between about 50 mg and about 1000 mg, and mechanically abrading the surface of the pellets to form alloy dust particles while maintaining the substantial surface integrity of the pellets. If desired, the process may include both the steps of mechanically abrading the surface of the beads and mechanically abrading the surface of the pellets. The selenium-tellurium-arsenic alloy in the pellets may then be vacuum deposited to form a photoconductive layer of an electrophotographic imaging member which comprises a substrate and, optionally, one or more other layers.

U.S.-A No. 4,205,098 to Kobayashi et al, issued May 27, 1980—A process is disclosed in which a powdery material of selenium alone or at least with one additive is compacted under pressure to produce tablets, the tablets being degassed by heating the tablets at an elevated temperature below the melting point of the metallic selenium and thereafter using the tablets as a source for vacuum deposition. The tablets formed by compacting the powdery selenium under pressure may be sintered at a temperature between about 100° C. and about 220° C. Typical examples of sintering conditions include 210° C. for between about 20 minutes and about 1 hour and about 1 to about 4 hours at 100° C. depending upon compression pressure. Additives mentioned include Te,As,Sb,Bi,Fe,Tl,S, I,F,Cl,Br,B,Ge,PbSe,-CuO,Cd,Pb,BiCl$_3$,SbS$_3$,Bi$_2$,S$_3$,Zn,CdS$_2$,SeS and the like. In one example, tablets having a thickness of 2mm and a diameter of 6mm were sintered and degassed at about 210° C. for about 18 minutes. This patent, however, does not include normalizing and repelletizing to maintain the physical state.

U.S.-A No. 4,609,605 to Lees et al, issued Sept. 2, 1968—A multilayered electrophotgraphic imaging member is disclosed in which one of the layers may comprise a selenium-tellurium-arsenic alloy. The alloy can be prepared by grinding selenium-tellurium-arsenic alloy beads, with or without halogen doping, preparing pellets having an average diameter of about 6 mm from the ground material, and evaporating the pellets in crucibles in a vacuum coater.

U.S.-A No. 4,297,424 to Hewitt, issued Oct. 27, 1981—A process is disclosed for preparing a photoreceptor wherein selenium-tellurium-arsenic alloy shot is ground, formed into pellets and vacuum evaporated.

U.S.-A No. 4,554,230 to Foley et al, issued Nov. 19, 1985—A method is disclosed for fabricating a photoreceptor wherein selenium-arsenic alloy beads are ground, formed into pellets and vacuum evaporated.

In U.S.-A No.4,205,098 to Kobayashi et al, issued May, 27, 1980—A method for producing selenium pellets is disclosed wherein selenium or selenium and additives are formed into powder and then compacted into pellets and vacuum evaporated. The additives may include tellurium and arsenic.

U.S.-A No. 3,524,745 to Cerlon et al, issued Aug. 18, 1970—A process is disclosed for preparing a photoreceptor wherein selenium-arsenic-antimony alloys are ground into fine particles and vacuum evaporated.

U.S.-A No. 4,710,442 to Koelling et al, issued Dec. 1, 1987—An arsenic-selenium photoreceptor is disclosed wherein the concentration of arsenic increases from the bottom surface to the top surface of the photoreceptor such that the arsenic concentration is about 5 weight percent at a depth about 5 to 10 microns on the top surface of the photoreceptor and is about 30 to 40 weight percent at the top surface of the photoreceptor. The photoreceptor is prepared by heating a mixture of selenium-arsenic alloys in a vacuum in a step-wise manner such that the alloys are consequentially deposited on the substrate to form a photoconductive film with an increasing concentration of arsenic from the substrate interface to the top surface of the photoreceptor. In one specific embodiment, a mixture of 3 selenium-arsenic alloys are maintained at an intermediate temperature in the range of from about 100° to 130° C. for a period of time sufficient to dry the mixture. The alloy may also contain a halogen. In Example X, the drying step temperature was attained in about 2 minutes and maintain for a period of approximately 3 minutes.

U.S.-A No. 4,583,608 to Field et al, issued Apr. 22, 1986—Heat treatment of single crystal superalloy articles are described. In one embodiment, single crystal particles are heat treated by using a heat treatment cycle during the initial stages of which incipient melting occurs within the articles being treated. During a subsequent step in heat treatment process substantial diffusion occurs in the article. In a related embodiment, single crystal articles which have previously undergone incipient melting during a heat treatment process are prepared by a heat treatment process. In still another embodiment, a single crystal composition of various elements including chromium and nickel is treating to heating steps at various temperatures. In column 3, lines 40–47, a stepped treatment cycle is employed in which an alloy is heated to a temperature below about 25° F. of an incipient melting temperature and held below the incipient melting temperature for a period of time sufficient to achieve a substantial amount of alloy homogenization.

U.S.-A No. 4,585,621 to Oda et al, issued Apr. 29, 1986—Various selenium alloys, e.g., Se-Te and Se-As, containing phosphorous are vacuum deposited on a substrate to form a photoreceptor.

U.S.-A No. 4,632,849 to Ogawa et al, issued Dec. 30, 1986—A method for making a fine powder of a metallic compound coated with ceramics is described. The process involves heating a gaseous mixture of at least methyl vapor and another element to a temperature not higher than 0.8 times as low as the melting point of the metal so that the metal and other element are reactive with each other while rapidly cooling to form a fine powder metallic compound. The metallic powder is further passed into another metal vapor to cover the metal powder with the other metal. The reaction system is cooled to a region in which the metal compound is kept stable to prevent further growth of the particles.

Swiss Patent Publication No. CH-656-486-A, published June 30, 1986—PbTe, DbSn, Te, ZnTe and CdHgTe are produced by liquid phase epitaxy, the solvent for the telluride being a melt of arsenic telluride and/or antimony telluride.

Japanese Patent Publication No. J6 0172-346-A, published Sept. 5, 1985—TlSe are placed in a crucible and heated at 180°–190° C., Mg is added to the melting alloy, the temperature is raised to the 200°–220° C. and allowed to stand at this temperature to form a uniform alloy of TlMgSe. The alloy is used in electric field-releasing ion beam generators.

U.S.-A No. 4,484,945 to Badesha et al, issued Nov. 27, 1984—A process is disclosed for preparing chalcogenide alloys by providing a solution mixture of oxides of the desired chalcogens and subsequently subjecting this mixture to a simultaneous co-reduction reaction. Generally the reduction reaction is accomplished at relatively low temperature, not exceeding about 120° C.

Japanese Patent Publication No. 57-91567 to Tokyo Shibaura Denki K.K., published June 7, 1982—An amorphous photoconductive material is obtained by combining selenium, arsenic, antimony and tellurium. This raises the glass transition point.

U.S.-A No. 4,414,179 to Robinette, issued Nov. 8, 1983—A process is disclosed for preparing a selenium alloy comprising heating a mixture comprising selenium, arsenic and chlorine to a temperature between about 290° C. and about 330° C. to form a molten mixture, agitating the molten mixture to combine the components, continuing all agitation, raising the temperature of the mixture to at least 420° C. for at least about 30 minutes and cooling the mixture until it becomes a solid. This alloy may be vacuum deposited.

U.S.-A No. 4,015,029 to Elchiasak, issued Mar. 29, 1977—A selenium alloy evaporation technique for depositing photoconductive material onto a substrate is described. The technique involves incorporating 1 to 80% by weight of at least one non-volatile infra red absorbing heat sink in or within the body of inorganic photoconductive material and thereafter heating the resulting mixture with infra red heat.

U.S.-A No. 3,785,806 to Henrickson, issued Jan. 15, 1974—A process is disclosed for producing arsenic doped selenium by mixing finely divided selenium with finely divided arsenic in an atomic ratio of 1:4 and thereafter heating the mixture in an inert atmosphere to obtain a master alloy. The master alloy is then mixed with molten pure selenium to attain an arsenic content of between 0.1 and 2% by weight based on the selenium.

In U.S. application patent No. 3,911,091 to Karem et al, issued Oct. 7, 1975—A method is disclosed for fabricating a photoreceptor by incorporating trigonal selenium particles in an organic binder material.

Generally, prior alloy preparation techniques exhibit various deficiencies. Selenium shot particles may be crystallized by exposing the particles to high temperatures. However, crystallization of shot using high levels of heat causes agglomeration of the shot particles and renders the shot particles difficult to handle, weigh and the like. Moreover, difficulties have been encountered in achieving precise control of tellurium and/or arsenic fractionation in the outer surface of a vacuum deposited photoconductive layer. This, in turn, affects the physical or electrical properties of the final photoreceptor. Photoreceptors containing large batch to batch top surface tellurium or arsenic concentrations tend to exhibit correspondingly large batch to batch variations in physical or electrical properties which is unacceptable in high speed precision copiers, duplicators and printers because of copy quality variation. Moreover, variations in physical or electrical properties as a photoreceptor surface wears away during cycling is unacceptable in high speed precision copiers, duplicators and printers particularly during long length runs where, for example, the copy quality should be uniform from the first copy to thousands of copies. Modern sophisticated, high speed copiers, duplicators and printers are constrained by narrow operating windows that require photoreceptors having precise, predictable operating characteristics from one batch to the next and during cycling.

Thus, there is a need for an improved process for preparing photoreceptors comprising selenium alloys containing additives such as tellurium and/or arsenic.

SUMMARY OF THE INVENTION

Accordingly, it is an object of the present invention to provide an improved process for preparing selenium alloy materials for electrophotographic imaging member which overcomes the the above-noted disadvantages.

It is a further object of the present invention to provide an improved process which controls the relative quantity of tellurium formed in the top surface layer of vacuum deposited selenium alloys containing tellurium.

It is a further object of the present invention to provide an improved process which maintains batch to batch top surface tellurium concentrations in the top surface layer of vacuum deposited selenium alloys containing tellurium.

It is a further object of the present invention to provide an improved, simpler process which controls tellurium fractionation within narrower limits.

It is a further object of the present invention to provide an improved process which controls tellurium fractionation without equipment that require moving parts.

It is a further object of the present invention to provide an improved process which controls the sensitivity of photoreceptors to light within narrower limits.

It is a further object of the present invention to provide an improved process which increases photoreceptors fabrication yields.

It is a further object of the present invention to provide an improved process which reduces the level of tellurium fractionation.

It is a further object of the present invention to provide an improved process which reduces the tellurium distribution variation through the thickness of a selenium-tellurium alloy photoconductive layer.

It is a further object of the present invention to provide an improved process which provides condition stabilized alloy for evaporation.

It is a further object of the present invention to provide an improved process which eliminates uncontrolled and unpredictable physical changes in the evaporating alloy prior to the main evaporation which would otherwise have influenced fractionation behavior.

It is a further object of the present invention to provide an improved process which eliminates the effect of pre-de-exotherming stage variations in pellet preparation parameters - grinding, pelletizing and ambient conditions.

The above objects and others are accomplished in accordance with the present invention by providing pellets of an alloy comprising amorphous selenium and an alloying component select from the group consisting of tellurium, arsenic, and mixtures thereof, the pellets having an average weight between about 50 mg and about 1000 mg, exposing the pellets to an ambient temperature of between about 114° C. and about 190° C. until an exotherm occurs in the pellets resulting in substantially complete crystallization between about 104° C. and about 180° C., grinding the pellets into fresh powder having an average particle size of less than about 200 micrometers, and compressing the fresh powder into fresh pellets having an average weight between about 50 mg and about 1000 mg. Generally, the pellets subjected to the exotherm treatment are prepared by grinding shot or beads having an average particle size between about 300 micrometers and about 3,000 micrometers into a powder having an average particle size of less than about 200 micrometers and compressing the powder into pellets. The resulting fresh pellets may be heated in a vacuum chamber to vacuum deposit the alloy onto a substrate.

The substrate may be opaque or substantially transparent and may comprise numerous suitable materials having the required mechanical properties. The entire substrate may comprise the same material as that in the electrically conductive surface or the electrically conductive surface may merely be a coating on the substrate. Any suitable electrically conductive material may be employed. Typical electrically conductive materials include, for example, aluminum, titanium, nickel, chromium, brass, stainless steel, copper, zinc, silver, tin, and the like. The conductive layer may vary in thickness over substantially wide ranges depending on the desired use of the electrophotoconductive member. Accordingly, the conductive layer may generally range in thickness from about 50 Angstrom units to many centimeters. When a flexible electrophotographic imaging member is desired, the thickness may be between about 100 Angstrom units to about 750 Angstrom units. The substrate may be of any other conventional material including organic and inorganic materials. Typical substrate materials include insulating non-conducting materials such as various resins known for this purpose including polyesters, polycarbonates, polyamides, polyurethanes, and the like. The coated or uncoated substrate may be flexible or rigid and may have any number of configurations such as, for example, a plate, a cylindrical drum, a scroll, an endless flexible belt, and the like. The outer surface of the supporting substrate preferably comprises a metal oxide such as aluminum oxide, nickel oxide, titanium oxide, and the like.

In some cases, intermediate adhesive layers between the substrate and subsequently applied layers may be desirable to improve adhesion. If such adhesive layers are utilized, they preferably have a dry thickness betwen about 0.1 micrometer to about 5 micrometers. Typical adhesive layers include film-forming polymers such as polyester, polyvinylbutyral, polyvinlypyrolidone, polycarbonate, polyurethane, polymethylmethacrylate, and the like and mixtures thereof. Since the surface of the supporting substrate may be a metal oxide layer or an adhesive layer, the expression "supporting substrate" as employed herein is intended to include a metal oxide layer with or without an adhesive layer on a metal oxide layer.

Any suitable photoconductive alloy of selenium including binary, tertiary, quaternary, and the like alloys may be employed to form the vacuum deposited photoconductive layer. Preferred alloys include alloys of tellurium, arsenic, or tellurium and arsenic with or without a halogen dopant. Typical photoconductive alloys of selenium include selenium-tellurium, selenium-arsenic, selenium-tellurium-arsenic, selenium-tellurium-chlorine, selenium-arsenic-chlorine, selenium-tellurium-arsenic-chlorine alloys, and the like. Photoconductive alloys of selenium are to be distinguished from stoichiometric compounds of selenium such as arsenic triselenide ($As_2Se_3$). Stoichiometric compounds of selenium such as arsenic triselenide appear to present less of a fractionation problem compared to alloys of selenium such as alloys of selenium and tellurium. As employed herein, an alloy is defined as a non stoichiometric mixture of Se, Te and/or As and any of the other above named elements. The photoconductive alloys of selenium may be applied to a coated or uncoated substrate alone as the only photoconductive layer or it may be used in conjunction with one or more other layers such as a selenium or selenium alloy trasnport layer and/or a protective overcoat layer. Generally, the selenium-tellurium alloy may comprise between about 8.0 percent by weight and about 14.0 percent by weight tellurium and a halogen selected from the group consisting of up to about 70 parts per million by weight of chlorine and up to about 140 parts per million by weight of iodine all based on the total weight of the alloy with the remainder being selenium. The selenium-arsenic alloy may, for example, comprise between about 0.25 percent by weight and about 2.5 percent by weight arsenic and a halogen selected from the group consisting of up to about 70 parts per million by weight of chlorine and up to about 140 parts per million by weight of iodine all based on the total weight of the alloy with the remainder being selenium. The selenium-tellurium-arsenic alloy may comprise between about 5 percent by weight and about 45 percent by weight tellurium, between about 0.1 percent by weight and about 5 percent by weight arsenic and a halogen selected from the group consisting of up to about 70 parts per million by weight of chlorine and up to about 140 parts per million by weight of iodine all based on the total weight of the alloy with the remainder being selenium. The expressions "alloy of selenium" and "selenium alloy" are intended to include halogen doped alloys as well as alloys not doped with halogen. When employed as a single photoconductive layer in an electrophotographic imaging member, the thickness of the photoconductive selenium alloy layer is generally between about 45 micrometers and about 70 micrometers thick.

Selenium-tellurium and selenium-tellurium-arsenic alloy photoconductive layers are frequently employed as a charge generation layer in combination with a charge transport layer. The charge transport layer is usually positioned between a supporting substrate and the charge generating selenium alloy photoconductive layer. Generally, a selenium-tellurium alloy may comprise from about 55 percent by weight to about 95 percent by weight selenium and from about 5 percent by weight to about 45 percent by weight tellurium based on the total weight of the alloy. The selenium-tellurium alloy may also comprise other components such as less than about 5 percent by weight arsenic to minimize crystallization of the selenium and less than about 1000 parts per million by weight halogen. In a more preferred embodiment, the photoconductive charge generating selenium alloy layer comprises between about 5 percent by weight and about 20 percent by weight tellurium, between about 0.1 percent by weight and about 4 percent by weight arsenic, and a halogen selected from the group consisting of up to about 70 parts per million by weight of chlorine and up to about 140 parts per million by weight of iodine with the remainder being selenium. Optimum results are achieved when these charge generation layers contain between about 10 percent by weight and about 13 percent by weight tellurium, between about 0.5 percent by weight and about 2 percent by weight arsenic and less than about about 15 parts per million by weight chlorine with the remainder being selenium. Concentrations of tellurium exceeding about 20 percent by weight lead to high photoreceptor light sensitivity and high dark decay and concentrations of tellurium less than about 5 percent by weight results in low light sensitivity and loss of copy quality. When the concentration of arsenic exceeds about 4 percent by weight, the photoreceptor experiences excessive dark decay. The resistance of amorphous selenium photoreceptors to thermal crystallization and surface wear begins to degrade as the concentration of arsenic drops below about 0.1 percent by weight. As the chlorine content rises above about 70 parts per million by weight chlorine, the photoreceptor begins to exhibit high dark decay. The thickness of the generator layer is typically about 3 micrometers to 5 micrometers.

Any suitable selenium transport layer may be utilized as a transport layer underlying a photoconductive selenium alloy charge generating layer. The charge transport material may, for example, comprise pure selenium, selenium-arsenic alloys, selenium-arsenic-halogen alloys, selenium-halogen and the like. Preferably, the charge transport layer comprises a halogen doped selenium arsenic alloy. Generally, about 10 parts by weight per million to about 200 parts by weight per million of halogen is present in a halogen doped selenium charge transport layer. If a halogen doped transport layer free of arsenic is utilized, the halogen content should normally be less than about 20 parts by weight per million. Inclusion of high levels of halogen in a thick halogen doped selenium charge transport layer free of arsenic leads to excessive dark decay because dark decay is substantially a function of the total chlorine in a multi-layer imaging member. Imaging members containing high levels of halogen in a thick halogen doped selenium charge transport layer free of arsenic are described, for example, in U.S. Pat. No. 3,635,705 to Ciuffini, U.S. Pat. No. 3,639,120 to Snelling, and Japanese Patent Publication No. J5 61 42-537 to Ricoh, published June 6, 1981. Generally, halogen doped selenium arsenic alloy charge transport layers comprise between about 99.5 percent by weight to about 99.9 percent by weight selenium, about 0.1 percent to about 0.5 percent by weight arsenic and between about 10 parts per million by weight to about 200 parts per million by weight of halogen, the latter halogen concentration being a nominal concentration. The expression "nominal halogen concentration" is defined as the halogen concentration in the alloy evaporated in the crucible. The thickness of the charge transport layer is generally between about 15 micrometers and about 75 micrometers and preferably from about 25 micrometers to about 50 micrometers because of constraints imposed by the xerographic development system, constraints imposed by carrier transport limitations and for reasons of economics. The expression "halogen materials" is intended to include fluorine, chlorine, bromine, and iodine. Chlorine is the preferred halogen because of the ease of handling and stability of chlorine in a vacuum deposited film (apparently due to lack of out diffusion). Transport layers are well known in the art. Typical transport layers are described, for example, in U.S. Pat. No. 4,609,605 to Lees et al and in U.S. Pat. No. 4,297,424 to Hewitt, the entire disclosures of these patents being incorporated herein by reference.

If desired, an interface layer may be positioned between the transport layer and the charge generating photoconductive layer. The interface layer material may, for example, consist essentially of selenium and a nominal halogen concentration of about 50 parts by weight per million to bout 2,000 parts by weight per million halogen material with the remainder comprising selenium. Minor additions of arsenic might be added but are relatively undesirable and may require additional halogen to compensate for this arsenic addition. The halogen concentration in the deposited interface layer will typically be somewhat less than that in the alloy evaporated in the crucible. In order to achieve optimal device properties, the actual halogen content in any final interface layer should normally be greater than about 35 parts by weight per million. Inclusion of high levels of halogen in thick halogen doped selenium layers free of arsenic leads to excessive dark decay because dark decay is substantially a function of the total halogen in a multilayer imaging member. Imaging members containing high levels of halogen in a thick halogen doped selenium charge transport layer free of arsenic are described, for example, in U.S. Pat. No. 3,635,705 to Ciuffini, U.S. Pat. No. 3,639,120 to Snelling and Japanese Patent Publication No. J5 61 42-537 to Ricoh, published June 6, 1981. The use of interface layers is described in U.S. Pat. No. 4,554,230 to Foley et al, the entire disclosure of which is incorporated herein by reference.

The particles initially treated by the process of this invention may be in either shot (bead) particle or pellet particle form. Generally, to prepare shot (bead) particles, the components of selenium alloys are combined by melting the selenium and additives together by any suitable conventional technique. The molten selenium alloy is then shotted by any suitable method. Shotting is usually effected by quenching molten droplets of the alloy in a coolant such as water to form large particles of alloy in the form of shot or beads. Shotting processes for forming alloy beads are well known and described, for example, in U.S. Pat. No. 4,414,179 to S. Robinette, the entire disclosure of this patent being incorporated herein by reference. The alloy beads may have an average particle size of, for example, between about 300 micrometers and about 3,000 micrometers. Pellet particles may be prepared from shot particles by grinding shot particles into a powder and thereafter compressing the powder into relatively large pellets. Since shot particles are normally the precursors of pellets, the grinding of alloy in shot form is preferred over grinding of pellets to form an alloy powder that is subsequently compressed to form pellets because the labor and equipment intensive steps required for the first pelletizing steps prior to grinding are eliminated. To reclaim a "bad" alloy by means of this invention, the bad pellets are heat treated, ground into powder and then recompressed into new pellets. The re-grinding and pelletizing after heat treatment provides a critical difference.

Surprisingly, vacuum deposited layers formed directly from shot (beads) that is heat treated by exposing the shot to an ambient temperature of between about 114° C. and about 190° C. until an exotherm occurs in the shot at between about 170° C. and about 180° C., are characterized by high fractionation, resulting in unacceptable photoreceptor sensitivity whereas vacuum deposited layers formed from pellets subjected to the same heat treatment followed by grinding and repelletizing are characterized by controlled fractionation resulting in photoreceptor sensitivity within the specified values.

To prepare the alloy pellets, the alloy beads are usually rapidly ground in a conventional high speed grinder or attritor to form alloy particles having an average particle size of less than about 200 micrometers. Any other suitable grinding device may be utilized to pulverize the bead particles to form the fine alloy particles having an average particle size of less than about 200 micrometers. Typical grinders include hammer mills, jet pulverizers, disk mills, and the like. Depending upon the efficiency of the grinding device employed, the grinding of alloy beads to form alloy particles having an average particle size of less than about 200 micrometers can normally be accomplished in less than about 5 minutes. Longer grinding times may be employed, if desired.

After grniding, the fine alloy particles having an average particle size of less than about 200 micrometers are compressed by any suitable technique into large particles of alloy usually referred to as pellets having an averge weight between about 50 mg and about 1000 mg. A pellet weight greater than about 50 mg is preferred for ease of handling. When the pellet weight exceeds about 1000 mg, the rates of heat transfer will require adjustments to de-exotherming and/or evaporation parameters. The pellets may be of any suitable shape. Typical shapes include cylinders, spheres, cubes, tablets, and the like. Compression of the alloy particles into pellets may be accomplished with any suitable device such as, for example, a simple punch tableting press, a multi punch rotary tableting press, and the like. Particle size of the ground material and pelletizing parameters are rendered non-critical providing the conditions of this invention are met including that no residual exothermic behavior remains in the material after de-exotherming and that the material is reground and repelletized to form fresh pellets.

The selenium alloy pellet particles are subjected to a crystal forming treatment by exposing the pellets to a temperature of between about 114° C. and about 190° C. until an exotherm occurs in the pellets at, for example, between about 104° C. and about 180° C. Generally the heating temperature should be between about 10° C. and about 40° C. above the exotherm onset of the particular material. The heat treatment time should be sufficient to ensure that an exotherm occurs in said pellets at between about 104° C. and about 180° C. The expression "exotherm" is defined as the heat liberated by the crystallization of an amorphous material. The existence of an exotherm may be determined by use of a Differential Scanning Calorimeter or by observation of temperature rise when heated on a simple hot plate. Once the exotherm is reached the application of heat should be continued as the degree of self-sustaining is proportional to the percentage of crystallinity present, the exothermic change of state must be carried through to completion until no residual exotherm is detectable by a Differential Scanning Calorimeter. However, the temperature must not be so high as to cause selenium loss from the pellet. During the exotherm the physical state of the material changes from amorphous to crystalline with all the alloying elements becoming crystalline if present in sufficient quantity. It is imperative that substantially complete crystallization is achieved because variations in crystallinity have a large effect on batch to batch top surface arsenic and top surface tellurium therefore substantially complete crystallization is essential for total process control. Thus, preferably, 100 percent by weight of selenium in the pellet is converted to selenium crystals. As employed herein, the expression "selenium cyrstals" is defined as the non amorphous form produced by heating the material to the completion of the exothermic reaction and the expression "substantially complete crystallization" is defined as at least about 99 percent crystallized. Selenium crystallization may be determined by any suitable technique. Typical techniques for detecting selenium crystallization include Differential Scanning Calorimeter, X-Ray Diffraction and the like. Any suitable method may be employed to heat the selenium alloy pellets. Typical techniques include heating the pellets in an oven or other enclosure that provides a dry process for supplying an adequate amount of heat, e.g. fluid bed drier, and the like. If a vacuum coater is employed for heating, a vacuum is to be avoided during heating to exotherm and during the exothermic reaction because the vacuum causes loss of high vapor pressure species such as selenium. This loss of high vapor pressure species such as selenium will result in greater fractionation. Thus, heating to exotherm and the subsequent exothermic reaction is generally achieved at atmospheric or even superatmospheric pressure. Sufficient pressure should be present in the ambient environment to suppress loss of high vapor pressure species such as selenium during heating to exotherm and during the exothermic reaction.

The temperature and time for heating the pellets to exotherm depends on a number of variables such as the size of the pellets, composition of the selenium alloy, size of load charge, size of container, depth of load, and the like. The temperature and time employed should be sufficient to initiate and complete the exotherm. Generally, the heating temperature for completion of the exotherm for any given amorphous, or partially amorphous selenium alloy may be determined experimentally by conducting constant temperature runs at incrementally increased temperatures for different times until complete elimination of potential exothermic behavior in the product alloy is achieved. Where a high percentage of crystallinity is already present in the starting alloy the reaction will not be self sustaining but will oven/environment driven. Conversely low starting crystallinity will provoke a self sustaining reaction due to the high rate of heat evolution. When the heating temperatures are outside these ranges, the deposited photoconductive layer exhibits variability in fractionation, sensitivity and other electrical parameters together with low visual surface yields. The lower temperature should be adequate to start off the exothermic reaction but the upper temperature should not induce selenium loss or handling difficulties. The heat treated pellets of this invention exhibit no tendency to undergo an exothermic reaction upon reheating. A typical pellet heating technique for selenium alloy pellets comprising between about 10 percent by weight and about 13 percent by weight tellurium, between about 0.5 percent by weight and about 2 percent by weight arsenic and less than about about 15 parts per million by weight chlorine with the remainder being selenium, involves subjecting the pellet to a temperature of between 120° C. and 150° C., for between 20 minutes and 40 minutes until the exothermic reaction which occurs between 104° C. and 120° C. is substantially complete. The means of applying the heat and the upper temperature the material reaches is not particularly critical provided the upper temperature level referred to above is not exceeded. Crystallization of the material should now be substantially percent complete. Aging of shot material over long periods of time at either room temperature or temperatures well below the softening temperature of the alloy will ultimately lead to complete crystallization of the material but would require very long process times and consequently a high volume of "in process" material. For example, abraded alloy shot comprising about 0.5 percent As, about 12 ppm chlorine and the remainder Se described above required many weeks of heating at about 60° C. achieve complete crystallization. Heating at high temperatures near the softening temperature of selenium alloy shot or pellets to crystallize the selenium therein, results in the formation of agglomerates or "chunks" that greatly interfere with the proper handling, weighing and the like of shot or pellets prior to the final vacuum deposition step. Thus, an important purpose of the heat treatment is to create essentially complete crystallization of the alloy pellets in a rapid and controlled manner such that the peak temperature generated in the alloy does not cause excessive softening with consequent handling problems.

After completion of the exothermic reaction, the pellets may be cooled prior to grinding. Cooling may be effected by any suitable means. Typical cooling techniques include, slow cooling by mere exposure to ambient air temperatures, accelerated cooling with chilled foreced air, and the like. the rate of cooling, however, is unimportant and can be tailored for process requirements.

Surprisingly, vacuum deposited layers formed directly from pellets that are heat treated by exposing the pellets to an ambient temperature of between about 110° C. and about 190° C. until an exotherm occurs in the pellet at between about 104° C. and about 120° C., are characterized by unaccepatably high photoreceptor sensitivity whereas vacuum deposited layers formed from pellets subjected to the same heat treatment followed by grinding and repelletizing are characterized by photoreceptor sensitivity within the specified values.

The heat treated alloy pellets are ground into a fine powder having an average particle size of less than about 200 micrometers. Grinding of the pellets may be effected in any suitable manner such as described above with reference to the grinding of shot. Any suitable grinding device may be utilized to pulverize the pellet particles. Typical grinders include hammer mills, jet pulverizers, disk mills, and the like. Depending upon the efficiency of the grinding device employed, grinding alloy pellets to form alloy particles having an average particle size of less than about 200 micrometers can normally be accomplished at a rate of about 3 minutes per kilogram. A typical batch of about 10 kilograms would therefore take approximately 30 minutes. Using process of this invention, the regrinding parameters become non-critical and the ease of reprocessing is considerably enhanced.

After grinding, the fine alloy particles having an average particle size of less than about 200 micrometers are compressed by any suitable technique into pellets having an average weight between about 50 mg and about 1000 mg. A pellet weight greater than about 50 mg is preferred for ease of handling. When the pellet weight exceeds about 1000 mg, evaporation discontinuities are observed. The pellets may be of any suitable shape. Typical shapes include cylinders, spheres, cubes, tablets, and the like. Compression of the alloy particles into pellets may be accomplished with any suitable device such as, for example, a simple punch tableting press, a multi punch rotary tableting press, and the like. The compression parameters are rendered uncritical by the process this invention, the only limit being one of convenience to form pellets that substantially retain their integrity during normal handling. A typical minimum load value to form a pellet being about 0.15 tons and a typical maximum value for machine reliability being 0.5 tons. It is critical that substantially no residual exothermic behavior remains in the material after de-exotherming and that the material is reground and repelletized to fresh pellets.

In the process of this invention, it has been found that subjecting selenium alloy pellets to sufficient heating to initiate an exothermic change of state, grinding the pellets to form a powder and compressing the powder into pellets effectively controls fractionation of selenium arsenic alloys, selenium tellurium alloys and selenium tellurium arsenic alloys with or without halogen dopants and offers numerous advantages including controlling the relative quantity of tellurium formed in the top surface layer of vacuum deposited selenium alloys containing tellurium, maintaining batch to batch top surface tellurium concentrations in the top surface layer of vacuum deposited selenium alloys containing tellurium, controlling tellurium fractionation within narrower limits, controling tellurium fractionation without equipment that require moving parts, controlling the sensitivity of photoreceptors to light within narrower limits, increasing photoreceptors fabrication yields, reducing the level of tellurium fractionation, reducing the tellurium distribution variation through the thickness of a selenium-tellurium alloy photoconductive layer, providing condition stablised alloy for evaporation, minimizing uncontrolled and unpredictable physical changes in the evaporating alloy prior to the main evaporation which would otherwise have influenced fractionation behavior, and eliminating the effect of pre-de-exotherming stage variations in pellet preparation parameters.

In U.S.-A No. 4,770,965 issued Sept. 13, 1988, a process is described in which selenium-arsenic alloy may be at least partially crystallized by placing the selenium alloy in shot form in a crucible in a vacuum coater and heated to between about 93° C.(200° F.) and about 177° C. (350° F.) for between about 20 minutes and about one hour to increase crystallinity and avoid reticulation. The selenium-arsenic alloy material in shot form is preferably heated until from about 2 percent to about 90 percent by weight of the selenium in the alloy is crystallized. This selenium-arsenic alloy material shot may be crystallized completely prior to vacuum deposition to ensure that a uniform starting point is employed. This technique appears to be limited to the crystallization of shot of selenium or selenium alloyed with arsenic, chlorine and other halogens inside of a vacuum coater. Nothing relating to the grinding of pellets heated to exotherm followed by pelletizing is taught. Moreover, since the heat treatment is conducted in a vacuum coater, the disclosure in U.S.-A No. 4,770,865 would lead away from subsequent steps such as grinding and pelletizing. An extremely important distinction of the process of this invention over the process described in U.S.-A No. 4,770,965 is that the heat treatment and subsequent reprocessing is carried out outside the vacuum coater to overcome the undesirable effects of the exotherm within the coating cycle using untreated shot. When heat treatment without regrinding and pelletizing occurs, the subsequent evaporation is highly uncontrolled and leads to high fractionation whereas the reground and repelletized pellets of the process of the instant invention exhibit controlled and predictable behavior throughout the coating cycle.

Pellets that are substantially crystallized, preferably 100 percent crystallized, are essential in the process of this invention for optimum control of the alloy component concentration through the thickness of the deposited photoconductive layer. The degree of crystallization of selenium pellets can be readily determined by X-Ray diffraction spectra. As indicated above, the treatment process of this invention provides vacuum deposited selenium alloy layers having consistent and predictable levels of tellurium at the surface of the alloy layer.

The heating to exotherm, grinding and pelletizing steps may be effected well in advance of vacuum deposition of the alloy onto a substrate. If desired, intermediate steps, such as temporary storage, may be employed between the exotherm, grinding and pelletizing steps. However, it is believed that such intermediate steps are generally unnecessary and inefficient.

The alloy prepared by the process of this invention may be deposited by any suitable conventional technique such as vacuum evaporation. The specific conditions vary depending upon the proportions of components in the different selenium alloy materials utilized. Typical temperature ranges for vacuum deposition are between about 300° C. and about 350° C. for alloys of Se-Te; between about 250° C. and about 350° C. for alloys of Se-As; and between about 300° C. and about 350° C. for alloys of Se-As-Te at a vacuum of between about $5\times10^{-4}$ torr and about $8\times10^{-5}$ torr for between about 10 minutes and 25 minutes. It is generally desirable that the substrate temperature be maintained in the range of from about 60° C. to about 85° C. during deposition.

The first layer of multiple layered photoreceptors, such as a transport layer, also may be deposited by any suitable technique, such as vacuum evaporation. Thus, a transport layer comprising a halogen doped selenium-arsenic alloy may be evaporated by conventional vacuum coating devices to form the desired thickness. The amount of alloy to be employed in the evaporation boats of he vacuum coater will depend on the specific coater configuration and other process variables to achieve the desired transport layer thickness. Chamber pressure during evaporation may be of the order of about $1\times10^{-4}$ torr. Evaporation is normally completed in about 15 to 25 minutes with the molten alloy temperature ranging from about 250° C. to about 350° C. Other times and temperatures and pressures outside these ranges may be used as well understood by those skilled in the art. It is generally desirable that the substrate temperature be maintained in the range of from about 60° C. to about 85° C. during deposition of the transport layer. Additional details for the preparation of transport layers are disclosed, for example, in U.S. Pat. No. 4,297,424 to H. Hewitt.

The selenium-tellurium-arsenic alloy generating layer pellets may then be evaporated from crucibles in a vacuum coater using a time/temperature crucible profile designed to minimize the fractionation of the alloy during evaporation. In a typical crucible evaporation program, the selenium-tellurium-arsenic generating layer is formed in about 12 to about 30 minutes with a crucible temperature between 300° C. and 350° C. Additional details for the preparation of generating layers are disclosed, for example, in U.S. Pat. No. 4,297,424 to H. Hewitt, the entire disclosure thereof being incorporated herein by reference. Satisfactory results may be achieved with a selenium-tellurium-arsenic alloy photoconductive generating layer having a thickness between about 1 micrometer and about 20 micrometers. The selenium-tellurium-arsenic alloy photoreceptor of this invention provides all the required photographic responses as well as extending photoreceptor life. Selenium-tellurium-arsenic alloy generating layers having a thickness greater than about 20 micrometers generally induce excessive arsenic and tellurium fractionation control difficulties during photoreceptor fabrication. Thicknesses less than about 1 micrometer tend to wear too rapidly in automatic electrophotographic copiers, duplicators and printers. Optimum results are achieved with generating layers having a thickness between about 3 micrometers and about 7 micrometers.

The process of this ivention controls tellurium and arsenic fractionation within narrower limits. In addition, photoreceptor fabrication yields are improved. TSA and TSTE values can be controlled, for example, to be about above 2 percent above the starting values for arsenic and tellurium concentration.

A number of examples are set forth herein below that are illustrative of different compositions and conditions that can be utilized in practicing the invention. All proportions are by weight unless otherwise indicated. It will be apparent, however, that the invention can be practiced with many types of compositions and can have many different uses in accordance with the disclosure above and as pointed out hereinafter.

EXAMPLE I

An arsenic and selenium alloy comprising about 99.5 percent by weight selenium and about 0.5 percent arsenic, based on the total weight of the alloy, and about 20 parts per million chlorine was prepared as shot formed by water quenching droplets of a molten alloy having an average particle size of about 2200 micrometers. The shot was evaporated from stainless steel crucibles at an evaporation temperature of between about 280° C. and about 330° C. and an evaporation pressure between about $5\times10^{-4}$ and $8\times10^{-5}$ torr. The aluminum substrates utilized were cylindrical and comprised an outer aluminum oxide layer having a thickness of about 10 angstroms. The diameter of the aluminum cylinders was about 8 centimeters. The substrate temperature was maintained between 60° and 85° C. during this evaporation coating operation. The resulting halogen doped selenium transport layer had a thickness of about 55 micrometers and contained about 99.5 percent by weight selenium, about 0.5 percent arsenic and about 20 parts per million by weight chlorine.

The transport layer coated substrate was thereafter coated with amorphous selenium/tellurium alloy shot to form a charge generating photoconductive layer. The amorphous selenium/tellurium alloy shot comprised about 90 percent by weight selenium and 10 percent by weight tellurium based on the total weight of the alloy. These shot particles were formed by water quenching droplets of molten alloy having an average particle size of about 2200 micrometers. Prior to evaporation the shot was heat treated in an oven at about 180° C. for about 30 minutes to achieve the exothermic reaction and hence crystallization which occurred at about 160° C. After being allowed to slowly cool in ambient air, the shot was evaporated from stainless steel crucibles at an evaporation temperature of between about 320° and about 330° C. at a pressure of between about $5 \times 10^{-4}$ torr and $8 \times 10^{-5}$ torr. The substrate temperature was maintained between about 60° and 85° C. during this evaporation coating operation. The resulting selenium/tellurium generating layer had a thickness of about 5 micrometers and contained about 14 percent by weight tellurium at the top surface of the generator layer. The top surface concentration of tellurium was tested by detaching the deposited film from the coated substrate and determining the tellurium and arsenic concentrations through the film thickness by taper section using Electro Micro Probe Analysis techniques (EMPA). The high concentration of tellurium at the top surface of the generator layer resulted in electrical photoreceptor sensitivity at the 560 nanometer wavelength of 0.144 to 0.181 compared to a top specification value of 0.163.

EXAMPLE II

The procedures of Example I were repeated with identical materials to prepare and test another photoreceptor except that instead of forming the generator layer from crystalline selenium-tellurium alloy shot, the amorphous selenium-tellurium alloy shot particles were rapidly ground into a fine powder having an average particles size of about 30 micrometers in a hammer mill grinder (Paudel Grinder, Model 2A, available from Fuji Industries, Japan) for about 5 minutes. The ground alloy powder was then compressed into pellets having an average weight of about 300 mg in a pelletizer (Hata Pelletizer, Model HPT-22A, available from Hata Iron Works, Japan). Compression pressure in the pelletizer was about 15000 kg/cm2 and the pellets had a length of about 3 mm and a diameter of about 6 mm. The resulting alloy pellets were subjected to a heat treatment involved heating the pellets in the vacuum coater at about 120° C. for about 10 minutes to achieve an exothermic reaction which occurred at 105° C.-120° C. The pellets were then evaporated as described in Example I to form a generator layer. The resulting selenium-tellurium-alloy generator layer had a thickness of about 5 micrometers and contained about −14 percent by weight tellurium at the top surface of the generator layer. The top surface concentration of tellurium and arsenic was tested by detaching the deposited film from the coated substrate and determining the arsenic concentration at the top surface by EMPA. The high concentration of tellurium and arsenic at the top surface of the generator layer resulted in electrical photoreceptor sensitivity at the 560 nanometer wavelength of between 0.168 to 0.187 compared to a top specification value of 0.163.

EXAMPLE III

The procedures of Example II were repeated with identical materials to prepare and test another photoreceptor except that instead of forming the generator layer directly from heat treated selenium-tellurium alloy pellets, the heat treated selenium-tellurium alloy pellets were rapidly ground into a fine powder having an average particles size of about 30 micrometers in a hammer mill grinder (Paudel Grinder, Model 2A, available from Fuji Industries, Japan) for about 5 minutes. The ground alloy powder was then compressed into pellets having an average weight of about 300 mg in a pelletizer (Hata Pelletizer, Model HPT-22A, available from Hata Iron Works, Japan). Compression pressure in the pelletizer was about 15000 kg/cm2 and the pellets had a length of about 3 mm and a diameter of about 6 mm. The resulting alloy pellets were were evaporated as described in Example II to form a generator layer. The resulting selenium-tellurium-alloy generator layer had a thickness of about 5 micrometers and contained about 12 percent by weight tellurium at the top surface of the generator layer. The top surface concentration of tellurium was tested by detaching the deposited film from the coated substrate and determining the arsenic concentration at the top surface by EMPA. The lower controlled concentration of tellurium at the top surface of the generator layer resulted in electrical photoreceptor sensitivity values at the 560 nanometer wavelength of 0.0135 to 0.0140 compared with the specified range of 0.115 to 0.163.

What is claimed is:

1. A process for crystallizing particles of an alloy of selenium comprising providing pellets of an alloy comprising amorphous selenium and an alloying component selected from the group consisting of tellurium, arsenic, and mixtures thereof, said pellets having an average weight between about 50 mg and about 1000 mg, exposing said pellets to an ambient temperature of between about 114° C. and about 190° C. until an exotherm occurs in said pellets at between about 104° C. and about 180° C., carrying said exotherm through to substantial completion, grinding said pellets into fresh powder having an average particle size of less than about 200 micrometers, and compressing said fresh powder into fresh pellets having an average weight between about 50 mg and about 1000 mg.

2. A process for crystallizing particles of an alloy of selenium in accordance with claim 1 comprising preparing said pellets by grinding shot particles of said alloy having an average particle size between about 300 micrometers and about 3,000 micrometers to form a powder having an average particle size of less than about 200 micrometers, and compressing said powder into said pellets having said average weight of between about 50 mg and about 1000 mg.

3. A process for crystallizing particles of an alloy of selenium in accordance with claim 1 wherein said ambient temperature is between about 10° C. and about 40° C. greater than the temperature at which exotherm onset occurs.

4. A process for crystallizing particles of an alloy of selenium in accordance with claim 1 wherein said alloy comprises a halogen dopant.

5. A process for crystallizing particles of an alloy of selenium in accordance with claim 1 wherein said alloy comprises an alloy of selenium and arsenic comprising between about 0.1 percent by weight and about 5.0 percent by weight arsenic and up to about 1000 parts per million by weight halogen all based on the total weight of the alloy with the remainder being selenium.

6. A process for crystallizing particles of an alloy of selenium in accordance with claim 1 wherein said alloy comprises an alloy of selenium and tellurium comprising between about 5 percent be weight and about 45 percent by weight tellurium and up to about 1000 parts per million by weight halogen all based on the total weight of the alloy with the remainder being selenium.

7. A process for crystallizing particles of an alloy of selenium in accordance with claim 1 wherein said alloy comprises an alloy of selenium, arsenic and tellurium comprising between about 5 percent and about 45 percent by weight tellurium, between about 0.1 percent by weight and about 5 percent by weight arsenic and up to about 1,000 parts per million by weight halogen all based on the total weight of the alloy with the remainder being selenium.

8. A process for crystallizing particles of an alloy of selenium in accordance with claim 1 wherein said alloy comprises an alloy of selenium and arsenic comprising between about 0.1 percent by weight and about 5.0 percent be weight arsenic based on the total weight of the alloy with the remainder being selenium.

9. A process for crystallizing particles of an alloy of selenium in accordance with claim 8 wherein said alloy comprises an alloy of selenium and arsenic comprising between about 1 percent by weight and about 2.5 percent by weight arsenic based on the total weight of the alloy with the remainder being selenium.

10. A process for crystallizing particles of an alloy of selenium in accordance with claim 1 wherein said alloy comprises an alloy of selenium and tellurium comprising between about 5 percent by weight and about 45 percent by weight tellurium based on the total weight of the alloy with the remainder being selenium.

11. A process for crystallizing particles of an alloy of selenium in accordance with claim 1 wherein said alloy comprises an alloy of selenium, arsenic and tellurium comprising between about 5 percent and about 45 percent by weight tellurium, between about 0.1 percent by weight and about 5 percent by weight arsenic based on the total weight of the alloy with the remainder being selenium.

* * * * *